United States Patent
Preuschl

(10) Patent No.: US 9,425,370 B2
(45) Date of Patent: Aug. 23, 2016

(54) METHOD FOR PRODUCING A STRIPLIGHT AND STRIPLIGHT

(71) Applicant: OSRAM GmbH, Munich (DE)

(72) Inventor: Thomas Preuschl, Sinzing (DE)

(73) Assignee: OSRAM GmbH, Munich (DE)

( * ) Notice: Subject to any disclaimer, the term of this patent is extended or adjusted under 35 U.S.C. 154(b) by 76 days.

(21) Appl. No.: 13/952,784

(22) Filed: Jul. 29, 2013

(65) Prior Publication Data

US 2014/0027800 A1  Jan. 30, 2014

(30) Foreign Application Priority Data

Jul. 30, 2012  (DE) .......................... 10 2012 213 309

(51) Int. Cl.
*H01L 33/62* (2010.01)
*F21Y 103/00* (2016.01)

(52) U.S. Cl.
CPC . *H01L 33/62* (2013.01); *F21S 4/24* (2016.01); *F21Y 2103/003* (2013.01); *H01L 2924/0002* (2013.01)

(58) Field of Classification Search
CPC ...................................................... H01L 33/62
USPC ........................................................... 257/91
See application file for complete search history.

(56) References Cited

U.S. PATENT DOCUMENTS

| 6,880,955 B2* | 4/2005 | Lin ................................ 362/237 |
| 7,273,300 B2* | 9/2007 | Mrakovich ................ 362/249.01 |
| 7,556,405 B2* | 7/2009 | Kingsford ............ H05K 1/0284 361/600 |
| 8,360,599 B2* | 1/2013 | Ivey et al. ...................... 362/218 |
| 2004/0032747 A1* | 2/2004 | Currie et al. .................. 362/551 |
| 2006/0146531 A1* | 7/2006 | Reo et al. ....................... 362/244 |
| 2007/0274067 A1 | 11/2007 | Sloan et al. |
| 2013/0021811 A1* | 1/2013 | Goldwater .................... 362/473 |

FOREIGN PATENT DOCUMENTS

| CN | 201462525 U | 5/2010 |
| DE | 202011100036 U1 | 10/2011 |

* cited by examiner

*Primary Examiner* — Lex Malsawma
(74) *Attorney, Agent, or Firm* — Viering, Jentschura & Partner mbB

(57) ABSTRACT

A method for producing a striplight is disclosed. Said method utilizing at least the following steps: (a) providing a strip-shaped carrier, which is populated on at least one side with a plurality of semiconductor light sources; (b) arranging at least one electrical line on the carrier; and (c) casting the at least one electrical line on the carrier. A striplight which has: a strip-shaped carrier, populated on at least one side with a plurality of semiconductor light sources; at least one electrical line, which is arranged on the carrier; and joint casting of the carrier and the at least one electrical line, is likewise disclosed.

13 Claims, 2 Drawing Sheets

METHOD FOR PRODUCING A STRIPLIGHT AND STRIPLIGHT

RELATED APPLICATIONS

The present application claims priority from German application No.: 10 2012 213 309.7 filed on Jul. 30, 2012.

TECHNICAL FIELD

The disclosure relates to a method for producing a striplight, wherein the method includes at least providing a strip-shaped carrier which is populated on at least one side with a plurality of semiconductor light sources. The disclosure also relates to a striplight, wherein the striplight has a strip-shaped carrier, which is populated on at least one side with a plurality of semiconductor light sources, and at least one electrical line. The disclosure can be used in particular for flexible LED strips.

BACKGROUND

Striplights are known in which light-emitting diodes are arranged in series on a front side of a flexible strip-shaped printed circuit board, for example striplights of the type LINEARlight FLEX by OSRAM. The printed circuit board can be electrically connected at one end, for example by means of a plug-type connector or the like. The printed circuit board has conductor tracks, which are formed by means of thin copper layers (with a height of no more than 70 micrometers). The conductor tracks may have a height of up to, 70 micrometers. Such conductor tracks, owing to their small cross-sectional area, have a comparatively high electrical resistance, which limits the length of the striplights which can be achieved in practice. It is known, for example for protection against electric shock and/or for protection against the external environment, to surround strip lights with a transparent casting compound.

WO 2007/041805 A1 discloses an elongate lighting means, i.e. a cable light, and methods for producing same. The lighting means has substantially parallel elongate electrical conductors, which extend in the longitudinal direction, and light-emitting apparatuses, which extend, spaced apart from one another, along the longitudinal direction of the light-emitting means and are connected between the electrical conductors. The lighting means has an elongate inner body with cutouts, in which the electrical conductors are accommodated. Part of each conductor protrudes out of the cutout in which it is accommodated, and this part is connected to the light-emitting apparatuses, for example by means of soldering. The arrangement with the inner body, the electrical conductors and the light-emitting apparatuses is inserted in an external translucent or transparent cover. The inner body and the outer cover are preferably formed by extrusion of silicone elastomers. In a preferred production method, the inner body is extruded with the electrical conductors in order to form a cable, wherein the material of the inner body completely envelops the electrical conductors. Then, strips in the longitudinal direction are peeled off from this material in order to expose the conductor sections. The light-emitting apparatuses are then connected, and the resultant arrangement is enveloped by extrusion with the external envelope. This lighting means can only be produced with a degree of complexity.

DESCRIPTION

Various embodiments of the disclosure provide a method for producing a striplight, wherein the method includes at least the following steps: (a) providing a strip-shaped carrier, which can be or is populated on at least one side with a plurality of semiconductor light sources; (b) arranging at least one electrical line on the carrier; and (c) casting the at least one electrical line on the carrier.

The at least one electrical line could have in particular at least two electrical lines, in particular precisely two or precisely three electrical lines. An electrical line can be used for power supply and/or data transmission.

The at least one electrical line is therefore produced separately from the carrier and is not restricted to the types of production used for conductor tracks. In particular, its cross-sectional area is not restricted to the cross-sectional area of conductor tracks, but can be substantially larger, with the result that it can have a much lower electrical resistance given the same length. In particular, at least one electrical line having a large cross section can thus be provided inexpensively. Owing to the fact that the carrier is arranged physically close (in contact or not in contact) to the at least one electrical line, joint casting with an in particular transparent casting compound is made possible in a simple manner. This method can be implemented particularly easily and without complex preparation steps, for example. In particular, the already completely populated but not yet cast carrier can be produced as was previously the case (for example an uncast striplight of the type LINEARlight FLEX) and does not need to be modified prior to casting. In particular, the at least one electrical line with a suitable arrangement can be provided for an existing method for producing a cast striplight only prior to casting.

Preferably, the at least one semiconductor light source includes at least one light-emitting diode. If more than one light-emitting diode is provided, these can illuminate with the same color or with different colors. A color can be monochromatic (for example red, green, blue, etc.) or multichromatic (for example white). The light emitted by the at least one light-emitting diode can also be an infrared light (IR-LED) or an ultraviolet light (UV-LED). A plurality of light-emitting diodes may produce a mixed light, for example a white mixed light. The at least one light-emitting diode can contain at least one wavelength-converting phosphor (conversion LED). The phosphor may alternatively or additionally be arranged so as to be remote from the light-emitting diode ("remote phosphor"), for example in the casting compound. The at least one light-emitting diode can be present in the form of at least one individually housed light-emitting diode or in the form of at least one LED chip. A plurality of LED chips can be mounted on a common substrate ("submount"). The at least one light-emitting diode can be equipped with at least one dedicated and/or common optical element for beam guidance, for example at least one Fresnel lens, collimator, etc. Instead of or in addition to inorganic light-emitting diodes, for example based on InGaN or AlInGaP, organic LEDs (OLEDs, for example polymer OLEDs) can generally also be used. Alternatively, the at least one semiconductor light source can have at least one diode laser, for example.

The strip-shaped carrier may be in particular a strip-shaped printed circuit board.

The strip-shaped carrier may in particular be a flexible carrier, for example consisting of polyimide. This enables in particular also the provision of a flexible striplight, in particular if the casting compound used for step (c) is a flexible casting compound, for example silicone.

However, a rigid carrier can also be used.

One development consists in that the carrier is already populated prior to the arrangement of the at least one electrical line. This facilitates production.

One development consists in that at least one electrical line is a metal wire. A wire is generally thin, long and flexible or deformable. The use of wire therefore does not or does not substantially impair flexibility of the light-emitting apparatus. The wire can have a circular, tetragonal, flat, etc., cross section. Iron, copper, bronze, aluminum, silver, gold and stainless steel and alloys may be used as metals, for example.

However, in general, electrical lines comprising a plurality of individual wires, in particular individual wires which are twisted with one another, may also be used.

The at least one electrical line may be accommodated in at least one cable. A cable can in particular be understood to mean a single-core or multi-core composite of wires encased with insulating materials. The at least one electrical line may represent parts of a single cable (for example multi-core ribbon cable) or, in the case of a plurality of electrical lines, be divided into a plurality of cables, for example.

The at least one electrical line can be flexible or alternatively practically rigid. In particular, flexible lines have the advantage that they can be pierced in the cut-off state, which facilitates the electrical connection of said lines. Rigid lines can have a larger cross-sectional area and therefore a lower resistance, if appropriate.

The arrangement of the at least one electrical line on the carrier includes an arrangement such that it or they can be cast jointly by a casting unit, for example an extruding machine.

The casting of the electrical line(s) on the carrier includes at least partial casting of the carrier. The at least partial casting in particular effects a form-fitting connection between the carrier and the at least one electrical line, possibly also a cohesive connection. In the case of partial casting, the light-emitting diodes or the emitter face of said light-emitting diodes can remain free, for example, and, if desired, may be cast in a further step, for example with a different casting compound. For example, the casting compound connecting the carrier and the at least one electrical line can be opaque, while the casting compound for casting the light-emitting diodes is transparent.

One configuration consists in that the arrangement on the carrier in step (b) includes laying the at least one electrical line on the carrier. Therefore, the at least one line makes mechanical contact with the carrier. As a result, a particularly compact cast striplight can be produced. Precise positioning of the electrical line(s) is thus also possible.

One configuration of this consists in that the arrangement in step (b) includes loosely laying the at least one electrical line on the carrier. Laying loosely is in particular understood to mean that the electrical line(s) is/are not held independently (not in a force-fitting, form-fitting and/or cohesive manner) on the carrier. Instead, the laying is effected by an external apparatus, for example a pressure application mechanism or tensioning mechanism, or by a gravitational force. This enables a particularly simple arrangement.

One configuration of this consists in that the arrangement in step (b) includes cohesively fastening the at least one electrical line on the carrier, for example by a bonding agent, for example a double-sided adhesive tape. Thus, particularly precise positioning of the at least one electrical line is made possible. However, the at least one line may also be pressed and thus held by the carrier in a force-fitting and/or form-fitting manner.

A further configuration consists in that the arrangement on the carrier in step (b) includes arranging the at least one electrical line spaced apart from the carrier. This has the advantage that the complexity involved in the mechanical contact-making of the electrical line(s) can be dispensed with. The spaced-apart arrangement can in particular include an arrangement with a small spacing.

In addition, one configuration consists in that the arrangement in step (b) includes tensioning the at least one electrical line. By virtue of the tensioning, the at least one electrical line may be drawn straight and can thus be laid in particular loosely on the carrier or held thereby with a defined spacing.

A further configuration consists in that the provision in step (a) includes providing a carrier which is only populated on its front side, and the arrangement in step (b) includes arranging the at least one electrical line on a rear side of the carrier. As a result, a configuration of the front side, for example routing of conductor tracks, may be configured so as to be largely uninfluenced by the presence of the at least one electrical line.

An alternative or additional development consists in that the method in step (a) includes providing a carrier which is only populated on its front side and the arrangement in step (b) includes arranging the at least one electrical line on the front side of the carrier. This facilitates electrical contact-making with the electrical line(s), for example by means of simple soldering, without the carrier itself needing to be set up for this purpose or needing to be subsequently treated for this purpose, for example needing to be provided with leadthroughs.

The method is generally also applied to carriers populated on two sides.

Yet a further configuration consists in that steps (b) and (c) include arranging and casting, respectively, at least one exposed (non-electrically insulated) electrical line. Exposed electrical lines, for example naked wires, facilitate electrical contact-making. In general, the at least one electrical line can also have an electrically insulating sheath or the like, for example in the form of one or more cables.

Another configuration consists in that the method includes a following step (d) of electrically connecting the at least one electrical line to at least some of the semiconductor light sources, possibly via an interposed conductor track structure. The electrical connection can be performed, as already described above, by soldering or welding (laser, resistance or friction welding) (in the case of at least one electrical line on a side facing away from the semiconductor light sources, possibly by means of vias). In particular if the at least one electrical line is arranged on a side facing away from the semiconductor light sources, electrical contact-making can also be performed, for example, by crimping, etc.

A further configuration consists in that the casting in step (c) includes completely casting the carrier and the at least one electrical line jointly. As a result, the casting may be performed in a particularly simple manner. The casting material used for this is preferably transparent.

Various embodiments of the disclosure provide a striplight, in particular produced in accordance with a method as described above, wherein the striplight has: a strip-shaped carrier, which is populated on at least one side with a plurality of semiconductor light sources; at least one electrical line, which is arranged on the carrier; and joint casting of the carrier and the at least one electrical line. This striplight has the same advantages as the method and can be designed analogously.

The above-described properties, features and advantages of this disclosure and the manner in which they are achieved become clearer and more easily understandable in connection with the schematic description of an exemplary embodiment below which is explained in connection with the drawings.

BRIEF DESCRIPTION OF THE DRAWINGS

FIG. 1 shows, in a side view, a detail of a strip-shaped carrier 11, which is populated on its front side 12 with semiconductor light sources in the form of light-emitting diodes 13. The carrier 11 can be flexible, for example, and consist of polyimide. The front side 12 can also have a conductor track structure (not depicted). Two parallel electrical lines 15 in the form of copper wires with a circular cross section are laid loosely on a rear side 14 of the carrier 11, as shown in FIG. 2 as well, i.e. they make contact with the rear side 14.

FIG. 3 shows a design for producing a striplight 16. With this design, first the populated strip-shaped carrier 11 and the two electrical lines 15 are provided. For example, the electrical lines 15 are applied loosely to the rear side 14 of the carrier 11 via deflecting rollers 17, as shown in FIG. 1 or FIG. 2, for example.

Figure 4:
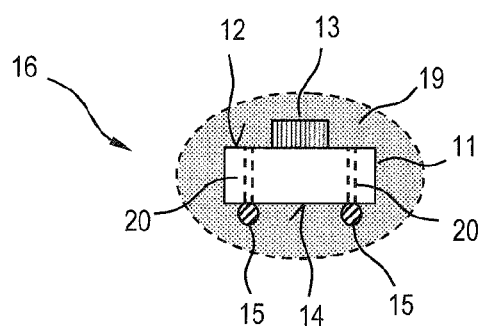
FIG. 4 shows, in a front view, a completely cast striplight.

The elements 11 to 15 are conveyed further into a casting machine 18, for example extruding machine, where they are encapsulated by casting jointly with casting compound 19 (see FIG. 4). In order to hold the electrical lines 15 on the carrier 11, the electrical lines 15 and possibly the carrier 11 are tensioned, for example by a dedicated tensioning apparatus (not depicted).

Figure 1:
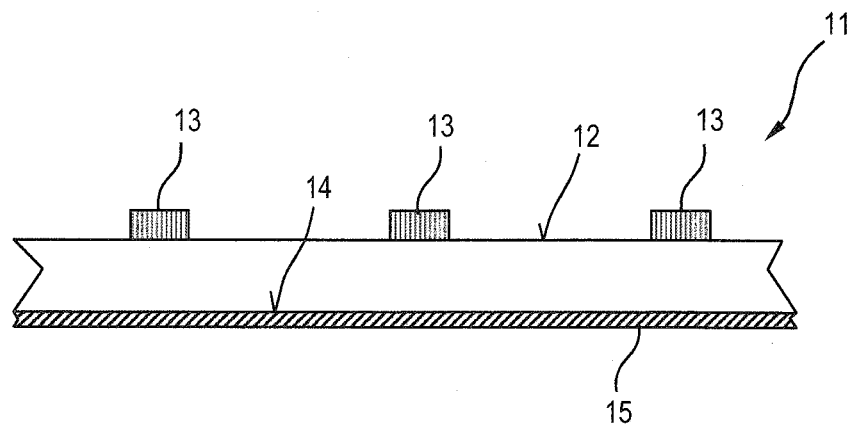
FIG. 1 shows, in a side view, a detail of a strip-shaped carrier with electrical lines arranged thereon.
Figure 2:
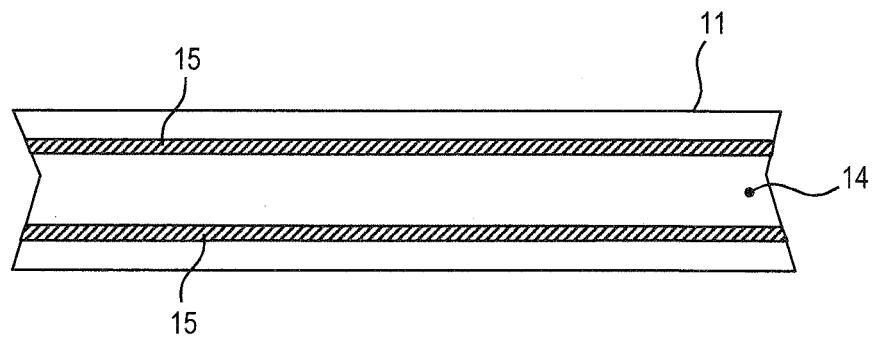
FIG. 2 shows the carrier with the electrical lines arranged thereon in a front view.
Figure 3:
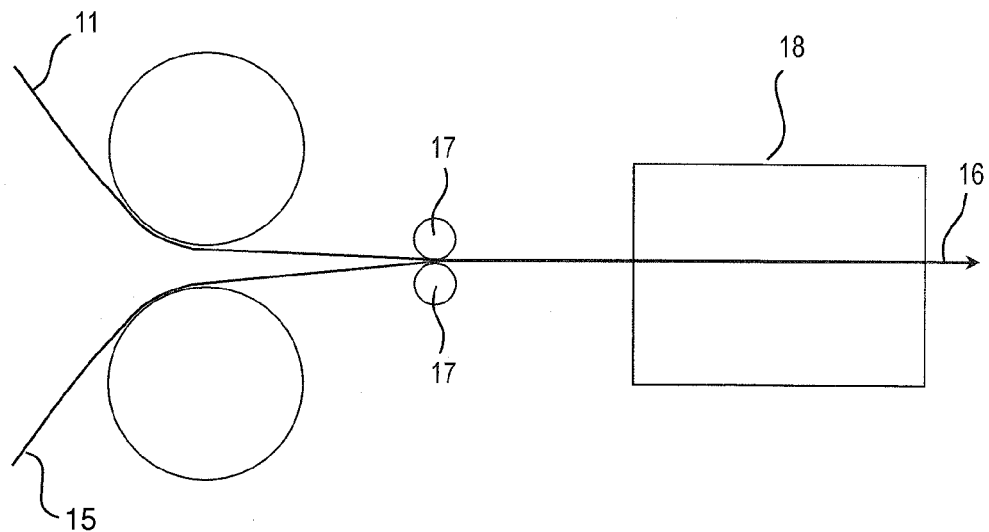
FIG. 3 shows a design for producing a striplight.

FIG. 4 shows, in a front view, a completely cast striplight 16. The striplight 16 can be produced in particular by means of a method and/or design described in FIG. 3. In contrast to the arrangement 11 to 15 shown in FIG. 2, the populated carrier 11 and the electrical lines 15 are now completely surrounded by the joint transparent casting compound 19, for example transparent or translucent silicone, for example with added phosphor. The casting compound 19 holds the electrical lines 15 at least in a form-fitting manner on the carrier 11.

In a further step, the electrical lines 15 can be electrically connected to the light-emitting diodes 13, for example by crimping or one or more crimping elements 20.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

LIST OF REFERENCE SYMBOLS

11 Carrier
12 Front side
13 Semiconductor light source
14 Rear side
15 Electrical line
16 Striplight
17 Deflecting roller
18 Casting machine
19 Casting compound
20 Crimping element

The invention claimed is:

1. A method for producing a striplight, wherein the method comprises:
   (a) providing a strip-shaped carrier, which is populated on at least one side with a plurality of semiconductor light sources; then
   (b) arranging at least one electrical line directly along the carrier; and
   (c) casting the at least one electrical line on the carrier.

2. The method as claimed in claim 1, wherein the arrangement on the carrier in (b) comprises laying the at least one electrical line on the carrier.

3. The method as claimed in claim 2, wherein the arrangement in (b) comprises loosely laying the at least one electrical line on the carrier.

4. The method as claimed in claim 2, wherein the arrangement in (b) comprises cohesively fastening the at least one electrical line on the carrier.

5. The method as claimed in claim 1, wherein the arrangement on the carrier in (b) comprises arranging the at least one electrical line spaced apart from the carrier.

6. The method as claimed in claim 1, wherein the arrangement in (b) comprises tensioning the at least one electrical line.

7. The method as claimed in claim 1, wherein the provision in (a) comprises providing a carrier which is only populated on its front side, and the arrangement in (b) comprises arranging the at least one electrical line on a rear side of the carrier.

8. The method as claimed in claim 1, wherein (b) and (e) comprise arranging and casting, respectively, at least one exposed electrical line.

9. The method as claimed in claim 1, wherein the method comprises (d) electrically connecting the at least one electrical line to at least some of the semiconductor light sources.

10. The method as claimed in claim 1, wherein the casting in (c) comprises completely casting the carrier and the at least one electrical line jointly.

11. The method as claimed in claim 1, wherein at least one of the plurality of semiconductor light sources is a light-emitting diode.

12. The method as claimed in claim 1, wherein the arrangement on the carrier in (b) comprises laying the at least one electrical line on the carrier beyond at least one semiconductor light sources.

13. The method as claimed in claim 1, wherein the at least one electrical line is arranged on a side opposite the side of the carrier which is populated with the plurality of semiconductor light sources.

* * * * *